(12) United States Patent
Sarangi et al.

(10) Patent No.: US 9,377,506 B2
(45) Date of Patent: Jun. 28, 2016

(54) CHIP DEBUG DURING POWER GATING EVENTS

(71) Applicant: Advanced Micro Devices, Inc., Sunnyvale, CA (US)

(72) Inventors: Shantanu Sarangi, San Jose, CA (US); Nehal Patel, Sunnyvale, CA (US); Christian Warling, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 152 days.

(21) Appl. No.: 14/230,139

(22) Filed: Mar. 31, 2014

(65) Prior Publication Data

US 2015/0276868 A1      Oct. 1, 2015

(51) Int. Cl.
*G01R 31/28* (2006.01)
*G01R 31/317* (2006.01)

(52) U.S. Cl.
CPC .............................. *G01R 31/31705* (2013.01)

(58) Field of Classification Search
CPC ................................................ G01R 31/31705
See application file for complete search history.

(56) References Cited

U.S. PATENT DOCUMENTS 9,047,474 B1 * 6/2015 Ahmad ................. G06F 21/575
2006/0218448 A1 * 9/2006 Allue ............... G01R 31/31705
714/45

* cited by examiner

*Primary Examiner* — Sam Rizk
(74) *Attorney, Agent, or Firm* — Volpe and Koenig, P.C.

(57) ABSTRACT

A system, method, and tangible computer readable medium for chip debug is disclosed. For example, the system can include a plurality of functional blocks, a debug path, and a debug bus steering module. The debug path couples the plurality of functional blocks in a daisy chain configuration, where an end functional block from the plurality of functional blocks is at an end of the daisy chain configuration. The debug bus steering module is configured to pass one or more debug signals associated with a first functional block from the plurality of functional blocks along the debug path to the end functional block while a second functional block from the plurality of functional blocks performs one or more power gating cycles.

20 Claims, 6 Drawing Sheets

CHIP DEBUG DURING POWER GATING EVENTS

BACKGROUND

1. Field

Embodiments included herein generally relate to debugging a chip (also referred to herein as "chip debug"). More particularly, embodiments relate to chip debug during power gating events.

2. Background

As the footprint and complexity of semiconductor chips grow, Design for Debug (DFD) has increasingly grown in importance to ensure the chip's speedy time to market. One DFD technique instantiates one or more debug wrappers within functional blocks of the chip. Debug wrappers are hardware- and/or software-based modules placed in one or more locations of the chip for debug purposes. These debug wrappers require signal observation and a daisy chain connection to an internal or external logic analyzer/trace capture buffer. Oftentimes, this DFD technique is implemented in chip designs with power gating techniques (e.g., system-on-a-chip integrated circuits) used to save power during different modes of operation (e.g., standby mode of operation). Such power gating techniques can impact and complicate debug observation. For example, the functional blocks are removed from the chip's power supply rails using sleep transistors. Due to the daisy chain configuration of the DFD technique, the debug/observation signals of functional blocks that are not powered down, but upstream of functional blocks that are powered down, cannot be observed.

SUMMARY OF EMBODIMENTS

Therefore, there is a need for flexibility in observing debug signals in functional blocks upstream of powered-down functional blocks, as well within the powered-down functional blocks during power on and off events (e.g., power gating events).

An embodiment includes a system for chip debug. The system can include a plurality of functional blocks, a debug path, and a debug bus steering module. The debug path couples the plurality of functional blocks in a daisy chain configuration, where an end functional block from the plurality of functional blocks is at an end of the daisy chain configuration. The debug bus steering module is configured to pass one or more debug signals associated with a first functional block from the plurality of functional blocks along the debug path to the end functional block while a second functional block from the plurality of functional blocks performs one or more power gating cycles.

The system can also include a logic analyzer/trace capture buffer and a power gating finite state machine (PGFSM). The logic analyzer/trace capture buffer is coupled to an output of the end functional block and configured to receive the one or more debug signals. The PGFSM is configured to enable and disable the one or more power gating cycles of the second functional block.

Another embodiment includes a method for chip debug. One or more functional blocks from a plurality of functional blocks are power cycled. The plurality of functional blocks is coupled in a daisy chain configuration along a debug path, where an end functional block from the plurality of functional blocks is at an end of the daisy chain configuration. One or more debug signals associated with a first functional block from the plurality of functional blocks are passed along the debug path to the end functional block during the power cycling of the one or more functional blocks.

A further embodiment includes a tangible computer readable medium having stored therein one or more sequences of one or more instructions for execution by one or more processors to perform a method for chip debug. One or more functional blocks from a plurality of functional blocks are power cycled. The plurality of functional blocks is coupled in a daisy chain configuration along a debug path, where an end functional block from the plurality of functional blocks is at an end of the daisy chain configuration. One or more debug signals associated with a first functional block from the plurality of functional blocks are passed along the debug path to the end functional block during the power cycling of the one or more functional blocks.

Further features and advantages of the embodiments disclosed herein, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to a person skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the embodiments and to enable a person skilled in the relevant art to make and use the invention.

Figure 1:
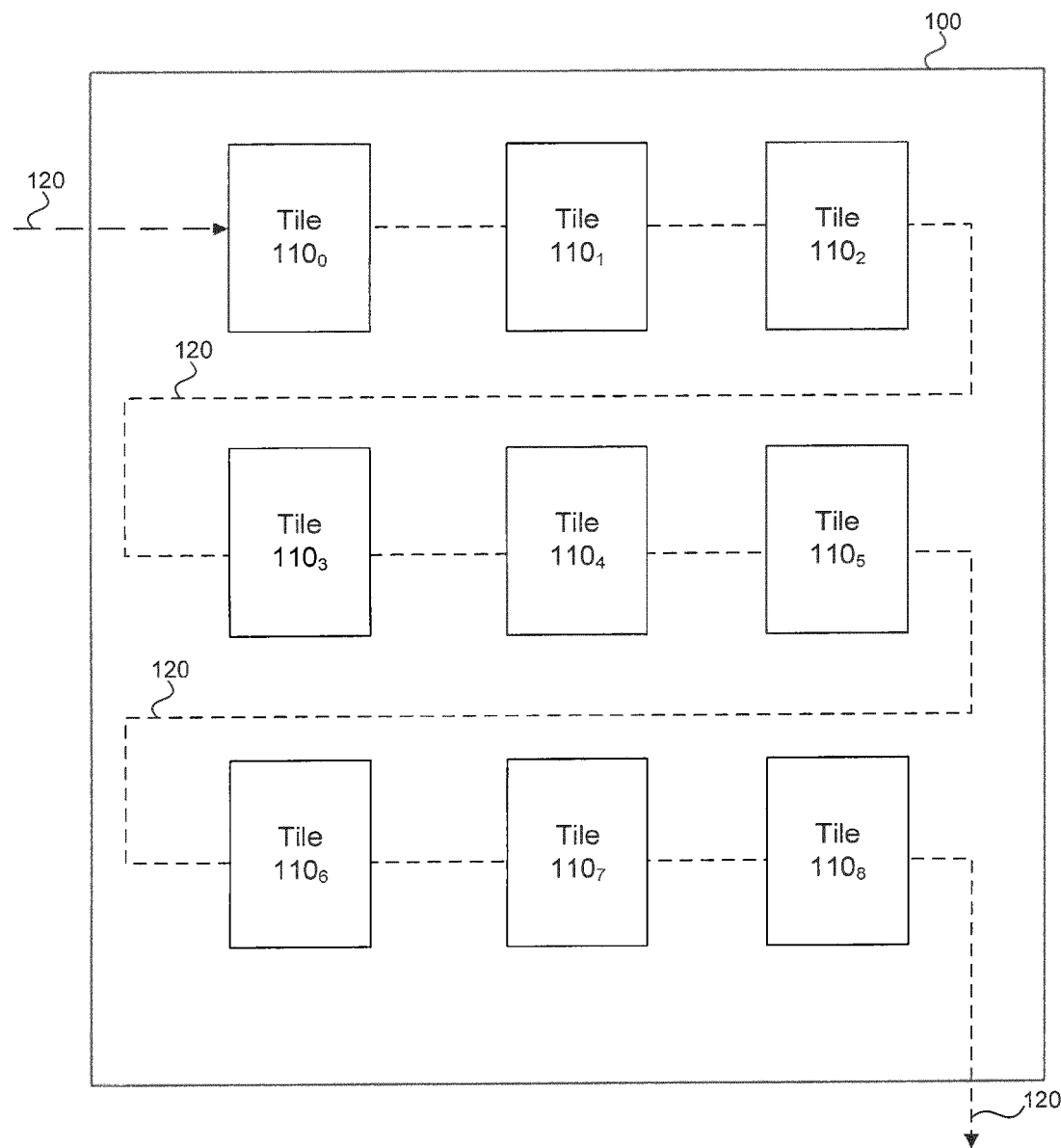
FIG. 1 is an illustration of an example system in which embodiments, or portions thereof, can be implemented.

Embodiments will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following detailed description refers to the accompanying drawings that illustrate example embodiments consistent with this invention. Other embodiments are possible, and modifications can be made to the embodiments within the spirit and scope of the disclosure herein. Therefore, the detailed description is not meant to limit the scope of the invention. Rather, the scope of the invention is defined by the appended claims.

It would be apparent to a person skilled in the relevant art that the embodiments, as described below, can be implemented in many different forms of software, hardware, firmware, and/or the entities illustrated in the figures. Thus, the operational behavior of embodiments of the present invention will be described with the understanding that modifications and variations of the embodiments are possible, given the level of detail presented herein.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of a person skilled in the relevant art to effect such feature, structure, or characteristic in connection with other embodiments whether or not explicitly described.

FIG. 1 is an illustration of an example system 100 in which embodiments, or portions thereof, can be implemented. In an embodiment, system 100 is a chip (e.g., semiconductor chip) that includes tiles $110_0$-$110_8$. The chip can be, for example, a semiconductor integrated circuit that includes tiles $110_0$-$110_8$. System 100 can be sub-divided into tiles, or partitions, that can be processed or transformed into, for example, physical circuits. For example, each of tiles $110_0$-$110_8$ is a physical partition—known to a person skilled in the relevant art—that contains one or more functional blocks. In an embodiment, each of the one or more functional blocks includes one or more processing units. In another embodiment, the one or more functional blocks can each include one or more processing units that execute instructions in parallel and/or in a pipeline manner with one or more processing units in other tiles $110_0$-$110_8$. Further, as would be understood by a person skilled in the relevant art, the backend design of system 100 can be performed at the tile-level or partition-level. Although nine tiles (e.g., nine partitions) are illustrated in FIG. 1, based on the description herein, a person skilled in the relevant art will recognize that more or less tiles can be implemented in system 100.

In referring to FIG. 1, dotted line 120 represents a debug path for system 100 (also referred to herein as "debug path 120"). In an embodiment, debug path 120 connects tiles $110_0$-$110_8$ in a daisy chain manner and provides a path for debug signals. At the beginning of debug path 120 (e.g., entry of dotted line 120 into tile $110_0$), one or more control signals can be asserted to system 100 to observe one or more debug signals within tiles $110_0$-$110_8$ (e.g., from a debug wrapper included in each of tiles $110_0$-$110_8$). At the end of debug path 120 (e.g., exit of dotted line 120 from tile $110_8$), the one or more debug signals from tiles $110_0$-$100_8$ can be observed using, for example, a logic analyzer/trace capture buffer (not shown in FIG. 1). The logic analyzer/trace capture buffer can be implemented within or outside of system 100. For example, on-chip logic analysis can be implemented in system 100 (e.g., on-chip trigger module 295 in FIG. 2B) to detect one or more "triggering events." These events can be detected at, for example, full system speed. Based on the triggering events, debug data can be captured. Information on an exemplary logic analyzer/trace capture buffer can be found in U.S. Patent Application Publication No, 2012/0151262, titled "Debug State Machines and Methods of their Operation," filed Apr. 27, 2011, which is incorporated by reference herein in its entirety. As would be understood by a person skilled in the relevant, a debug wrapper refers to a hardware- and/or software-based module that can be used for the purposes of chip debug. For example, the debug wrapper can provide an interface to allow internal signals of a chip to be observed by, for example, a logic analyzer/trace capture buffer.

Based on the description herein, although tiles $110_0$-$110_8$ from FIG. 1 are connected in a daisy chain manner via debug path 120, a person skilled in the relevant art will recognize that other debug paths are possible and within the spirit and scope of the embodiments disclosed herein. For example, two daisy chain debug paths can be used to connect tiles $110_0$-$110_8$ in different configurations.

Figure 2A:
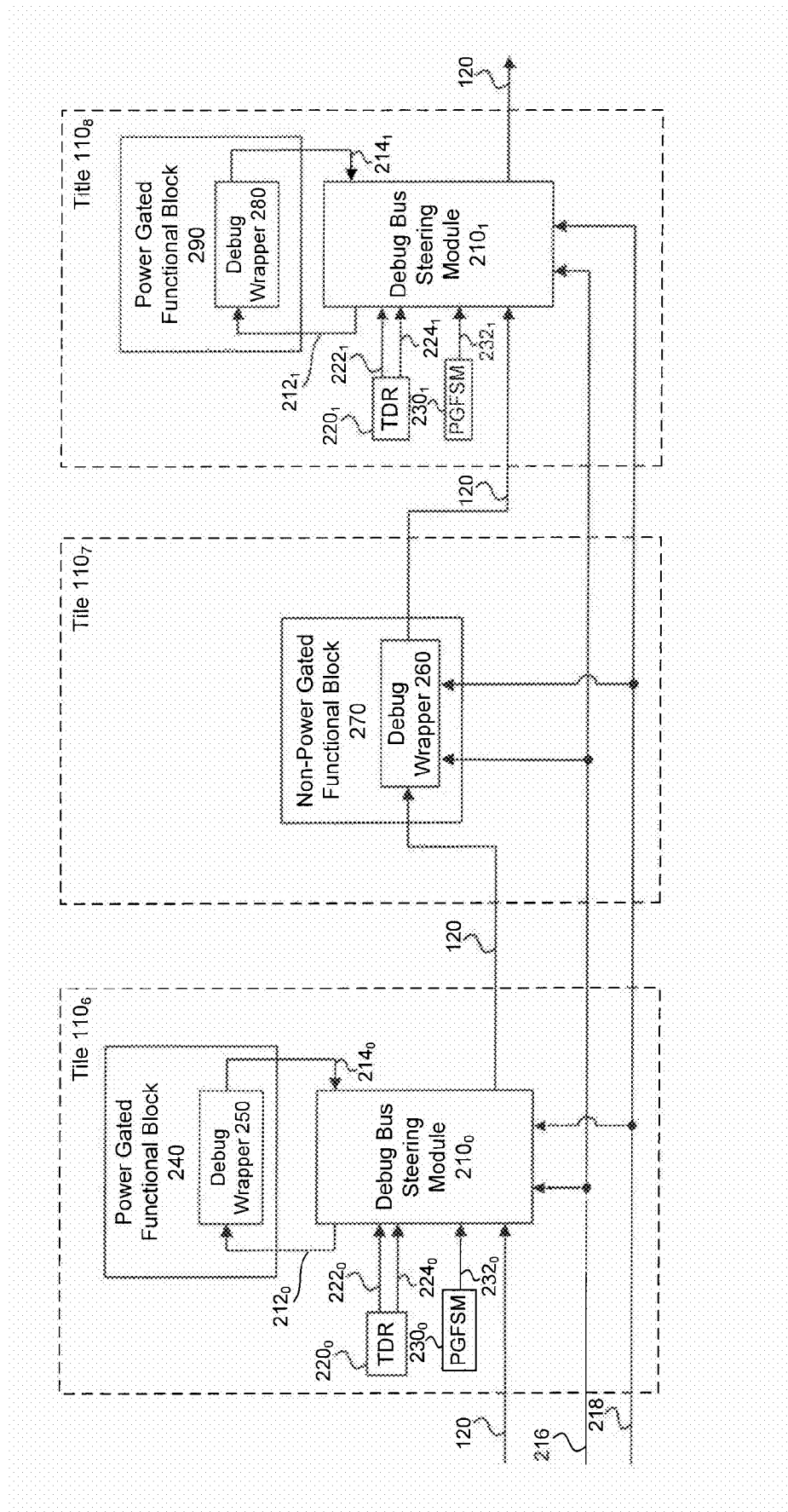
FIG. 2A is an illustration of a portion of an example system incorporating an embodiment of a debug bus steering module.

FIG. 2A is an illustration of a portion of system 100 incorporating an embodiment of a debug bus steering module 210. Tile $110_6$ includes a debug bus steering module $210_0$, a test-to-data register (TDR) $220_0$, a power gating finite state machine (PGFSM) $230_0$, a power gated functional block 240, and a debug wrapper 250. Tile $110_7$ includes a debug wrapper 260 and a non-power gated functional block 270. Tile $110_8$ includes a debug bus steering module $210_1$, a TDR $220_1$, a PGFSM $230_1$, a debug wrapper 280, and a power gated functional block 290. The PGFSM is a type of power gating sequencer, which is known by a person skilled in the relevant art. Based on the description herein, a person skilled in the relevant art will recognize that other types of power gating sequencers can be used with the embodiments disclosed herein.

Power gated functional blocks 240 and 290 can be powered down by PGFSMs $230_0$ and $230_1$, respectively, to save power during one or more modes of operation of system 100 (e.g., standby mode of operation), according to an embodiment. This power up/down mode is also referred to herein as a "power gated event," in which one or more tiles in system 100 can power up/down while one or more other tiles remain powered on. In an embodiment, the power gated event can occur in a dynamic manner as will be described below. Power gated functional blocks 240 and 290 can each implement one or more sleep transistors—controlled by PGFSMs $230_0$ and $230_1$—configured to cut off or disconnect internal analog and/or digital circuits therein from power supply rails providing power to these functional blocks, according to an embodiment.

In an embodiment, when powering down power gated functional blocks 240 and 290, PGFSMs $230_0$ and $230_1$ reset their respective power gated functional blocks, assert isolation clamps to separate the power gated functional blocks from their respective debug bus steering modules, and switch off analog and/or digital circuits associated with the power gated functional blocks (e.g., activate sleep transistors). Conversely, when powering up power gated functional blocks 240 and 290, PGFSMs $230_0$ and $230_1$ follow the reverse sequence: switch on the analog and/or digital circuits associated with the power gated functional blocks (e.g., de-activate sleep transistors); de-assert the isolation clamps; and, release the reset to the power gated functional blocks. In tile 1107, non-power gated functional block 270 does not undergo a power gated event and remains powered on during all modes of operation associated with system 100, according to an embodiment.

Each of functional blocks 240, 270, and 290 include debug wrappers 250, 260, and 280, respectively, to implement one or more debug/diagnostic functions within their respective functional blocks. Each of debug wrappers 250, 260 and 280 facilitates debug operations and can include a debug data bus and one or more observability circuits. As would be understood by a person skilled in the relevant art, many integrated circuit systems—such as system 100—include multiple hardware blocks (e.g., tiles). With the implementation of debug wrappers, internal signals from each of the hardware blocks (e.g., tiles) can be observed and the resulting data can be used for debug purposes. Debug wrappers are known to persons skilled in the relevant art. As will be explained below, signals resulting from the one or more debug/diagnostic functions can be outputted from each of the debug wrappers onto debug path 120, which can ultimately serve as an input to, for example, a logic analyzer/trace capture buffer.

In an embodiment, TDR 220, PGFSM 230, and debug bus steering module 210 remain powered on during all modes of operation associated with system 100. Although debug bus steering modules $210_0$ and $210_1$, TDRs $220_0$ and $220_1$, and PGFSMs $230_0$ and $230_1$ are depicted as residing in tiles $110_6$ and $110_8$, all of these elements, or a portion thereof, can reside outside their respective tiles, according to an embodiment. For example, these elements, or a portion thereof, can reside in a centralized location outside of the tile boundaries but within system 100. Further, although a PGFSM is depicted for each of tiles $110_6$ and $110_8$, one global PGFSM can be implemented in system 100 to control the debug bus steering modules and power gated events associated with each of the tiles.

Figure 2B:
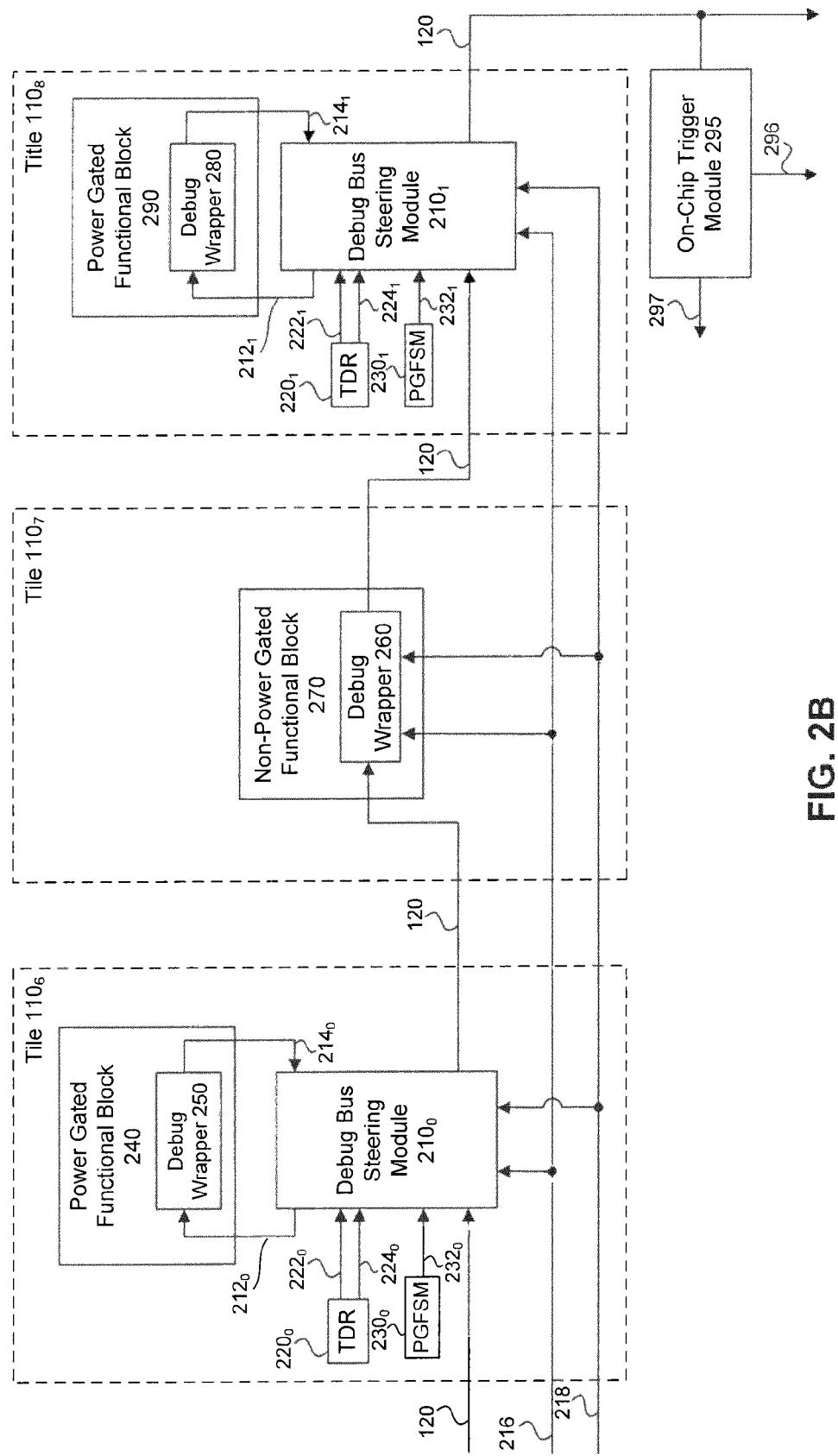
FIG. 2B is an illustration of a portion of an example system incorporating an embodiment of a debug steering module and an embodiment of an on-chip trigger module.

FIG. 2B is an illustration of a portion of an example system incorporating an debug steering module 210 and an embodiment of an on-chip trigger module 295. In an embodiment, on-chip trigger module 295 is integrated into system 100 of FIG. 1 to provide on-chip logic analysis. For example, on-chip trigger module 295 can be used to detect one or more triggering events, observe internal signals, control triggering of internal and external test signals or a combination thereof. On-chip trigger module 295 can receive signals on debug path 120 for further processing—e.g., observe internal signals and control triggering events of internal test signals via a control signal 297—according to an embodiment. In an embodiment, on-chip trigger module 295 can select signals to output to, for example, a logic analyzer/trace capture buffer via a debug path 296.

Figure 3:
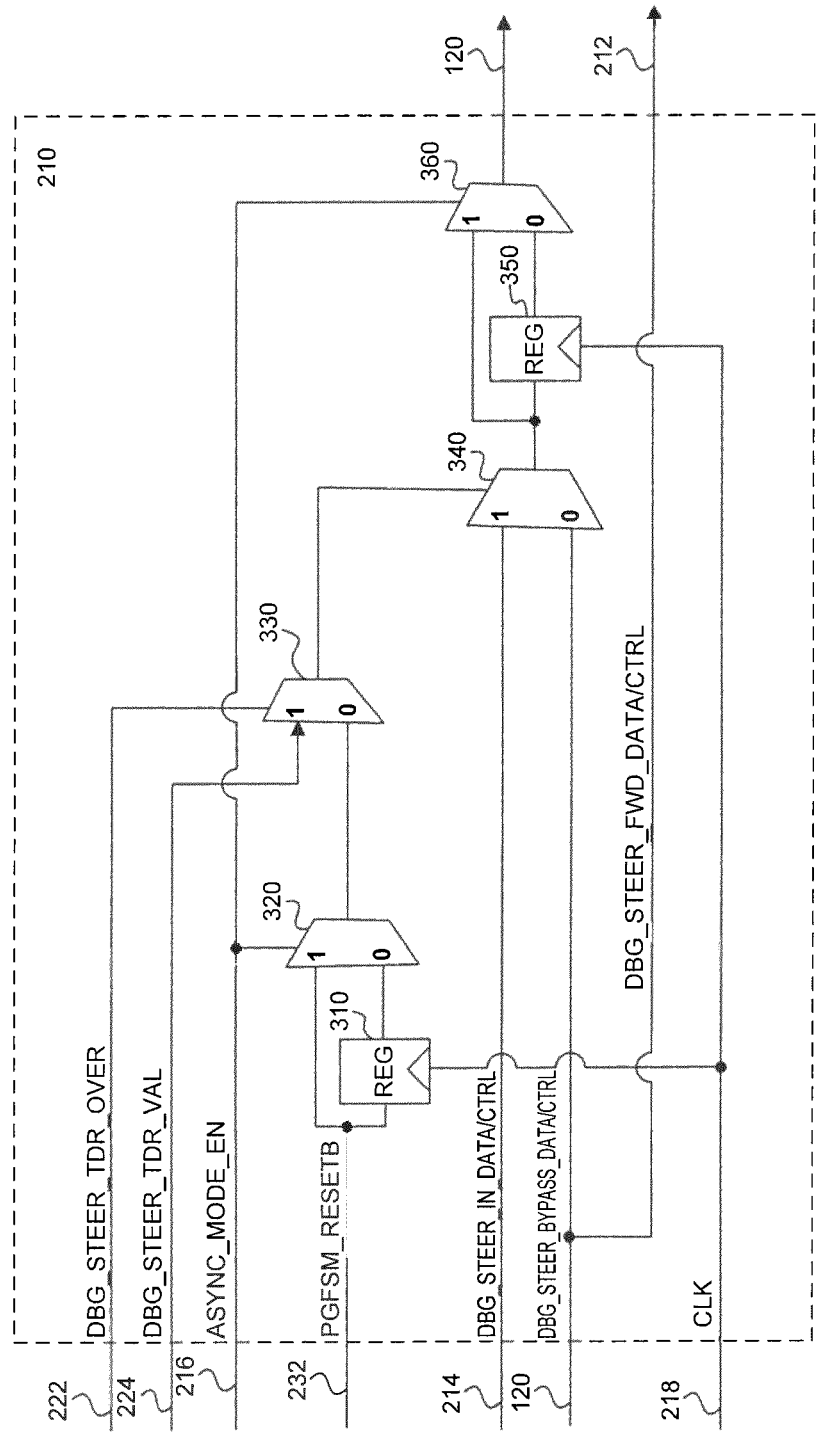
FIG. 3 is an illustration of an embodiment of a debug bus steering module.

FIG. 3 is an illustration of an embodiment of debug bus steering module 210. Debug bus steering module 210 includes multiplexers 320, 330, 340, and 360 and synchronization registers 310 and 350. In an embodiment, debug bus steering module 210 includes the following inputs: a DBG_STEER_TDR_OVER signal 222, a DBG_STEER_TDR_VAL signal 224, an ASYNC_MODE_EN signal 216, a PGFSM_RESETB signal 232, a DBG_STEER_IN_DATA/CTRL signal 214, a DBG_STEER_BYPASS_DATA/CTRL signal traversing debug path 120, and a clock signal 218.

In reference to FIGS. 2A and 2B, TDR 220 provides DBG_STEER_TDR_OVER signal 222 and DBG_STEER_TDR_VAL signal 224 to debug bus steering module 210. PGFSM 230 provides PGFSM_RESETB signal 232 to debug bus steering module 210. A debug wrapper associated with a tile implementing debug bus steering module 210 (e.g., debug wrapper 250 in tile $110_6$ and debug wrapper 280 in tile $110_8$) provides DBG_STEER_IN_DATA/CTRL signal 214 to debug bus steering module 210.

ASYNC_MODE_EN signal 216 and clock signal 218 are global signals provided by a control unit or processing unit external to the tiles, according to an embodiment. For example, ASYNC_MODE_EN signal 216 and clock signal 218 can be generated by one or more control units or processing units external to the tiles but within system 100. Alternatively, ASYNC_MODE_EN signal 216 and clock signal 218 can be generated by one or more control units or processing units external to system 100.

In referring to FIG. 3, in an embodiment, debug bus steering module 210 has two outputs: a DBG_STEER_FWD_DATA/CTRL signal 212; and, the output from multiplexer 360. The output from multiplexer 360 can be either a DBG_STEER_BYPASS_DATA/CTRL signal entering debug bus steering module 210 via debug path 120 or DBG_STEER_IN_DATA/CTRL signal 214 from a debug wrapper (e.g., debug wrapper 250 in tile $110_6$ and debug wrapper 280 in tile $110_8$). DBG_STEER_FWD_DATA/CTRL signal 212 traverses debug path 120 and serves as an input to the debug wrapper. For ease of explanation and cross-referencing between figures, although the DBG_STEER_FWD_DATA/CTRL signal traverses debug path 120, this portion of the debug path is labeled as "212" to differentiate the portion of the debug path that serves as an input to the debug wrapper (e.g., debug wrappers 250 and 280 of FIGS. 2A and 2B) and the portion of the debug path that traverses between tiles (e.g., debug path 120 between tiles $110_6$ and $110_7$ and debug path between tiles $110_7$ and $110_8$ in FIGS. 2A and 2B).

The input signals to and output signals from debug bus steering module 210 will be described in further detail in the context of the debug bus steering module's modes of operation. In an embodiment, debug bus steering module 210 has two modes of operation: a dynamic control mode of operation; and, a pass-through mode of operation. Each of these modes of operation can be performed in a synchronous or an asynchronous manner, according to an embodiment. The dynamic control and pass-through modes of operation will be described first, followed by a description of the synchronous and asynchronous performance of these modes.

In referring to FIG. 3, in the dynamic control mode of operation, DBG_STEER_TDR_OVER signal 222 is set "low" (e.g., programmed to '0' in TDR 220 of FIGS. 2A and 2B) to select control input '0' from multiplexer 330. In particular, PGFSM_RESETB signal 232 is selected as the output for multiplexer 330. In an embodiment, a synchronous version or an asynchronous version of PGFSM_RESETB signal 232 can be selected at the output of multiplexer 330.

In an embodiment, PGFSM_RESETB signal 232 is an active low signal used to control multiplexer 340. When PGFSM_RESETB signal 232 is set "low" (e.g., programmed to '0' in PGFSM 230 of FIGS. 2A and 2B), this indicates a reset in the PGFSM and the power gated functional block and, as a result, the DBG_STEER_BYPASS_DATA/CTRL signal on debug path 120 is passed to multiplexer 360 (via multiplexer 340) and ultimately to debug path 120 at the output of multiplexer 360. A synchronous version or an asynchronous version of the DBG_STEER_BYPASS_DATA/CTRL signal can be selected at the output of multiplexer 360, according to an embodiment.

In resetting the power gated functional block (e.g., setting PGFSM_RESETB signal 232 to "low"), this indicates the start of a power gating sequence for powering down the tile, according to an embodiment. Next, isolation clamps can be asserted to separate the power gated functional block from debug bus steering module 210 (which remains powered on). Analog and/or digital circuits associated with the power gated functional block are then switched off (e.g., activating sleep transistors). In effect, the power gated functional block is powered down and the tile associated with the powered down functional block is bypassed since the DBG_STEER_BYPASS_DATA/CTRL signal on debug path 120 (at the input of debug bus steering module 210) is passed to output debug path 120 of debug bus steering module 210 (at the output of multiplexer 360).

In an embodiment, the power gated functional block can be powered up in the reverse sequence: the analog and/or digital circuits associated with the power gated functional block are switched on (e.g., deactivating sleep transistors); isolation clamps are de-asserted; and, PGFSM_RESETB is set to "high" (e.g., programmed to a '1' in PGFSM 230 of FIGS. 2A and 2B). In referring to FIG. 3, by maintaining DBG_STEER_TDR_OVER signal 222 "low" and setting PGFSM_RESETB to "high," DBG_STEER_IN_DATA/CTRL signal 214 is passed to multiplexer 360 (via multiplexer 340) and ultimately to debug path 120 at the output of multiplexer 360. A synchronous version or an asynchronous version of DBG_STEER_IN_DATA/CTRL signal 214 can be selected at the output of multiplexer 360, according to an embodiment.

In an embodiment, the dynamic control mode of operation supports the observation of debug signals across multiple tiles while power gated functional blocks cycle through one or more power up/power down sequences (also referred to herein as "power gating cycles"). A benefit, among others, of the dynamic control mode of operation is that error conditions—similar to those that may occur during normal operation—can be reproduced and observed. In a system with multiple functional blocks sharing a debug path in a daisy chain configuration (e.g., system 100 of FIG. 1), the debug bus steering module can allow the observation of debug signals from one or more functional blocks performing power gating cycles, regardless of the location of the one or more functional blocks in the daisy chain configuration.

In an embodiment, a fixed set of debug signals can be concatenated from multiple functional blocks to form a debug bus chain observable at a downstream logic analyzer/trace capture buffer. For example, in referring to FIGS. 2A and 2B, it will be assumed that non-power gated functional block 270 in tile $110_7$ and power gated functional block 290 in tile $110_8$ are functional blocks to be observed. In this example scenario, power gated functional block 240 in tile $110_6$ is not being observed and can be bypassed by setting both DBG_STEER_TDR_OVER signal $222_0$ and PGFSM_RESETB signal $232_0$ in tile $110_6$ to "low" (e.g., programmed to '0' in TDR $220_0$ and PGFSM $230_0$, respectively). This, in turn, passes a signal on debug path 120 at the input of tile $110_6$ to output debug path 120 of tile $110_6$.

In an embodiment, a first set of debug signals from debug wrapper 260 in tile $110_7$ can be passed to debug path 120 between tiles $110_7$ and $110_8$. A second set of debug signals from debug wrapper 280 in tile $110_8$ can be concatenated to the first set of debug signals, in which the first and second sets of debug signals are passed to debug path 120 at the output of tile $110_8$ (e.g., to a logic analyzer/trace capture buffer), according to an embodiment. In an embodiment, the first set of debug signals are first passed to debug path 120 at the output of tile $110_8$, followed by the second set of debug signals. Conversely, the second set of debug signals can be first passed to debug path 120 at the output of tile $110_8$, followed by the first set of debug signals.

In either case, to coordinate the passing of the first and second debug signals to debug path 120 at the output of tile $110_8$, debug bus steering module $210_1$ in tile $110_8$ can be controlled such that the first and second sets of debug signals are passed to debug path 120 at the output of tile $110_8$ in a serial manner. In an embodiment, when passing the first set of debug signals from debug wrapper 260 in tile $110_7$ to debug path 120 at the output of tile $110_8$, DBG_STEER_TDR_OVER signal $222_1$ and PGFSM_RESETB signal $232_1$ in debug bus steering module $210_1$ are both set to "low," thus passing the first set of debug signals from debug wrapper 260.

To pass the second set of debug signals from debug wrapper 280 in tile $110_8$ to debug path 120 at the output of tile $110_8$, DBG_STEER_TDR_OVER signal $222_1$ remains "low" and PGFSM_RESETB $232_1$ transitions to "high," thus passing the second set of debug signals from debug wrapper 280.

In another embodiment, debug signals from power gated functional blocks can be observed during its power gating cycles. For example, in referring to FIGS. 2A and 2B, signals from debug wrapper 250 in power gated functional block 240 of tile $110_6$ can be observed during power gating cycles. Again, during the power down sequence, PGFSM_RESETB $222_0$ is set to "low," isolation clamps are asserted in tile $110_6$ to separate power gated functional block 240 from debug bus steering module $210_0$, and analog and/or digital circuits associated with power gated functional block 240 are switched off (e.g., activating sleep transistors). The power up sequence occurs in the reverse order: the analog and/or digital circuits associated with power gated functional block 240 are switched on (e.g., deactivating sleep transistors); isolation clamps are de-asserted; and, PGFSM_RESETB $222_0$ is set to "high." In an embodiment, during the power down and power up sequences, DBG_STEER_TDR_OVER signal $222_0$ remains "low."

After the power up sequence, debug signals from debug wrapper 250 (e.g., DBG_STEER_IN_DATA/CTRL $214_0$) can be observed by passing the debug signals along debug path 120 to the output of tile $110_8$ (e.g., to a logic analyzer/trace capture buffer) in a similar manner as described above. In particular, the debug signals traverse debug path 120 through non-power gated functional block 270 in tile $110_7$ and through debug bus steering module $210_1$ in tile $110_8$. In an embodiment, although not illustrated in FIGS. 2A and 2B (for ease of illustration), non-power gated functional block 270 includes control logic and bypass circuits to allow the debug signals to pass through tile $110_7$ via debug path 120.

A fixed signature can be used to indicate the beginning and end of a debug sequence, according to an embodiment. The fixed signature can have a programmable value generated by a programmable register in system 100 of FIG. 1 or can have a fixed value. For example, the fixed signature can initially be transferred from the beginning of debug path 120 in system 100 of FIG. 1 (e.g., input of tile $110_0$) to the end of debug path 120 (e.g., output of tile $110_8$) and received by a logic analyzer/trace capture buffer to indicate the beginning of the debug sequence. In an embodiment, the logic analyzer/trace capture buffer recognizes the initial receipt of the fixed signature as an indication that debug signals are to follow. The debug signals are transferred to the output of tile $110_8$ and then to the logic analyzer/trace capture buffer in a similar manner as described above. After completion of the debug sequence, another fixed signature is transferred along debug path 120 and received by the logic analyzer/trace capture buffer. The logic analyzer/trace capture buffer recognizes the receipt of this subsequent fixed signature as the end of the debug sequence and discontinues storing debug signal data and/or disables pattern matching functions, according to an embodiment.

The pass-through mode of operation is another mode of operation for the debug bus steering module. In referring to FIG. 3, DBG_STEER_TDR_OVER signal 222 is set "high" (e.g., programmed to a '1' in TDR 222 of FIGS. 2A and 2B) and DBG_STEER_TDR_VAL signal 224 is either set to "low" or "high" (e.g., programmed to a '0' or a '1', respectively, in TDR 222) during the pass-through mode of operation, according to an embodiment. When DBG_STEER_TDR_VAL is set to "low," the DBG_STEER_BYPASS_DATA/CTRL signal is passed to multiplexer 360 (via multiplexer 340) and ultimately to debug path 120 at the output of multiplexer 360. When DBG_STEER_TDR_VAL is set to "high," DBG_STEER_IN_DATA/CTRL signal 214 is passed to multiplexer 360 (via multiplexer 340) and ultimately to debug path 120 at the output of multiplexer 360. A synchronous version or an asynchronous version of the DBG_STEER_BYPASS_DATA/CTRL signal and DBG_STEER_IN_DATA/CTRL signal 214 can be selected at the output of multiplexer 360.

In an embodiment, the pass-through mode of operation supports the observation of debug signals from a functional block—e.g., either a power or non-power gated functional block—upstream of a tile with a power gated functional block that does not require observation. For example, in referring to FIGS. 2A and 2B, it will be assumed that non-power gated functional block 270 in tile $110_7$ is to be observed. In this example scenario, power gated functional block 240 in tile $110_6$ and power gated functional block 290 in tile $110_8$ are not be observed. However, these power gated functional blocks are performing power gating cycles. In an embodiment, the pass-through mode of operation allows the observation of debug signals from debug wrapper 260 in tile $110_7$ without any loss of debug data at the end debug path 120 (e.g. at the output of tile $110_8$).

In the above example scenario, debug data loss may occur at the end of debug path 120 (e.g., at the output of tile $110_8$) if the dynamic control mode of operation is used to observe the debug signals from debug wrapper 260 in tile $110_7$. This is because, for example, the pipeline depth through debug wrapper 280 and the pipeline depth through debug bus steering module $210_1$ in tile $110_8$ may be different from one another. In referring to FIG. 3, during power gating cycles in the dynamic control mode of operation, PGFSM_RESETB signal 232 toggles between "low" and "high." Here, incoming debug signals traversing on debug path 120 (e.g., the DBG_STEER_BYPASS_DATA/CTRL signal—debug signals from debug wrapper 260 in tile $110_7$) may not entirely pass to the output of multiplexer 360 since PGFSM_RESETB may toggle "low" before the debug signals can entirely pass through multiplexer 360.

A benefit, among others, of the pass-through mode of operation is that debug bus steering module 210 functions as a repeater circuit when passing incoming debug signals to its output. In referring to FIG. 3, when DBG_STEER_TDR_OVER signal 222 is set to "high" and DBG_STEER_TDR_VAL signal 224 is set to "low," the DBG_STEER_BYPASS_DATA/CTRL signal on debug path 120 is passed to the output of multiplexer 360 (via multiplexer 340). The DBG_STEER_BYPASS_DATA/CTRL signal is passed to the output of multiplexer 360 regardless of the value of PGFSM_RESETB signal 222, which may toggle between "low" and "high" during power gating cycles performed by a power gated functional block associated with debug bus steering module 210.

In an embodiment, the pass-through mode of operation can be used if there is only one power gated functional block that needs to be observed. For example, in referring to FIGS. 2A and 2B, if debug signals from debug wrapper 280 in tile $110_8$ need to be observed, then debug bus steering module $210_1$ can be configured to pass the debug signals to the output of tile $110_8$ for observation (e.g., by a logic analyzer/trace capture buffer). In particular, in referring to FIG. 3, DBG_STEER_TDR_OVER signal 222 and DBG_STEER_TDR_VAL signal 224 can both be set to "high," thereby passing DBG_STEER_IN_DATA/CTRL signal 214 (e.g., debug signals from debug wrapper 280) to the output of multiplexer 360 (via multiplexer 340). Here, DBG_STEER_IN_DATA/CTRL signal 214 is passed to the output of multiplexer 360 regardless of the value of PGFSM_RESETB signal 222, which may toggle between "low" and "high" during power gating cycles performed by power gated functional block 290.

In an embodiment, similar to the dynamic control mode of operation, a fixed signature can be used to indicate the beginning and end of a debug sequence during the pass-through mode of operation. The fixed signature can be generated by a programmable register in system 100 of FIG. 1 or can have a fixed value. For example, the fixed signature can initially be transferred from the beginning of debug path 120 in system 100 of FIG. 1 (e.g., input of tile $110_0$) to the end of debug path 120 (e.g., output of tile $110_8$) and received by a logic analyzer/trace capture buffer to indicate the beginning of the debug sequence. In an embodiment, the logic analyzer/trace capture buffer recognizes the initial receipt of the fixed signature as an indication that debug signals are to follow. The debug signals are transferred to the output of tile $110_8$ and then to the logic analyzer/trace capture buffer in a similar manner as described above. After completion of the debug sequence, another fixed signature is transferred along debug path 120 and received by the logic analyzer/trace capture buffer. The logic analyzer/trace capture buffer recognizes the receipt of this subsequent fixed signature as the end of the debug sequence and discontinues storing debug signal data and/or disables pattern matching functions, according to an embodiment.

The dynamic control and pass-through modes of operation described above can be performed in a synchronous manner or an asynchronous manner. In the synchronous manner, in referring to FIG. 3, ASYNC_MODE_EN is set "low" (e.g., programmed to '0'). Here, synchronization registers 310 and 350 output PGFSM_RESETB and the output of multiplexer 340 in a synchronous manner based on clock signal 218. In an embodiment, clock signal 218 can be a system clock internal or external to system 100 of FIG. 1. In an embodiment, clock signal 218 is synchronous with one or more clocks that drive debug wrappers 250, 260, and 280 in FIGS. 2A and 2B—e.g., clock signal 218 is in the same clock domain. For example, in having clock signal 218 in the same clock domain as the debug wrappers across multiple tiles, then chip-wide debug (e.g., debug of system 100 in FIG. 1) can be achieved using a single global clock.

In an embodiment, in referring to FIG. 3, synchronous register 350 can be used to provide a timing margin for the output of multiplexer 340—either DBG_STEER_IN_DATA/CTRL 214 or the DBG_STEER_BYPASS_DATA/CTRL signal on debug path 120. For example, in referring to FIGS. 2A and 2B, a debug bus steering module may not be physically adjacent to a debug wrapper in the same tile or in another upstream/downstream tile. In referring to FIG. 3, synchronous register 250 can be used to store the output of multiplexer 340 prior to outputting the stored data to multiplexer 360, thus providing a timing margin for the output of multiplexer 340.

In the asynchronous mode of operation, in referring to FIG. 3, ASYNC_MODE_EN is set "high" (e.g., programmed to '1'). In an embodiment, the asynchronous mode of operation can be used to provide a raw observation of the debug signals on debug path 120. The asynchronous mode of operation can be used when observing debug signals in a clock domain different from clock signal 218—e.g., clock signals are not synchronized.

Figure 4:
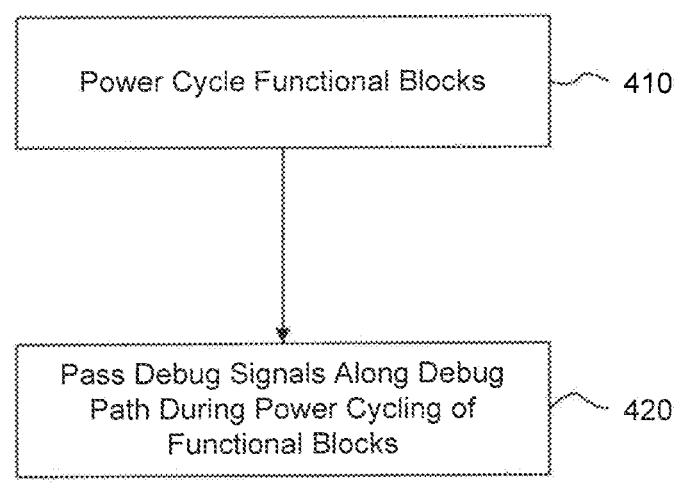
FIG. 4 is an illustration of an embodiment of a method for chip debug.

FIG. 4 is an illustration of an embodiment of a method 400 for chip debug. Method 400 can be performed using, for example, the embodiments illustrated in FIGS. 1-3. It is to be appreciated that method 400 may not require all steps or be performed in the order shown.

In step 410, one or more functional blocks from a plurality of functional blocks are power cycled or undergoing one or more power gating cycles (e.g., power gated functional blocks 240 and 290 in FIGS. 2A and 2B). In an embodiment, the plurality of functional blocks is coupled in a daisy chain configuration along a debug path (e.g., daisy chain configuration of debug path 120 in FIGS. 2A and 2B between the functional blocks). Here, power cycling or a power gating cycle refers to the enablement and disablement of power from the one or more functional blocks.

In step 420, one or more debug signals associated with a first functional block from the plurality of functional blocks are passed along the debug path to an end functional block during the power cycling of the one or more functional blocks in step 410. For example, in referring to FIGS. 2A and 2B, one or more debug signals can be passed from debug wrappers 250, 270, and 280 to the output of tile $110_8$ (e.g., associated with the end functional block).

In step 420, the passing of the one or more debug signals can occur in a synchronous manner or an asynchronous manner, according to an embodiment. Also, in an embodiment, the one or more debug signals can be concatenated with another one or more debug signals, in which the one or more debug signals and the another one or more debug signals are passed along the debug path in a serial manner. Further, when passing the one or more debug signals, a fixed signature can be used to indicate the beginning and end of a debug sequence. In an embodiment, the fixed signature can traverse the debug path, followed by the one or more debug signals, and then followed by the fixed signature.

Figure 5:
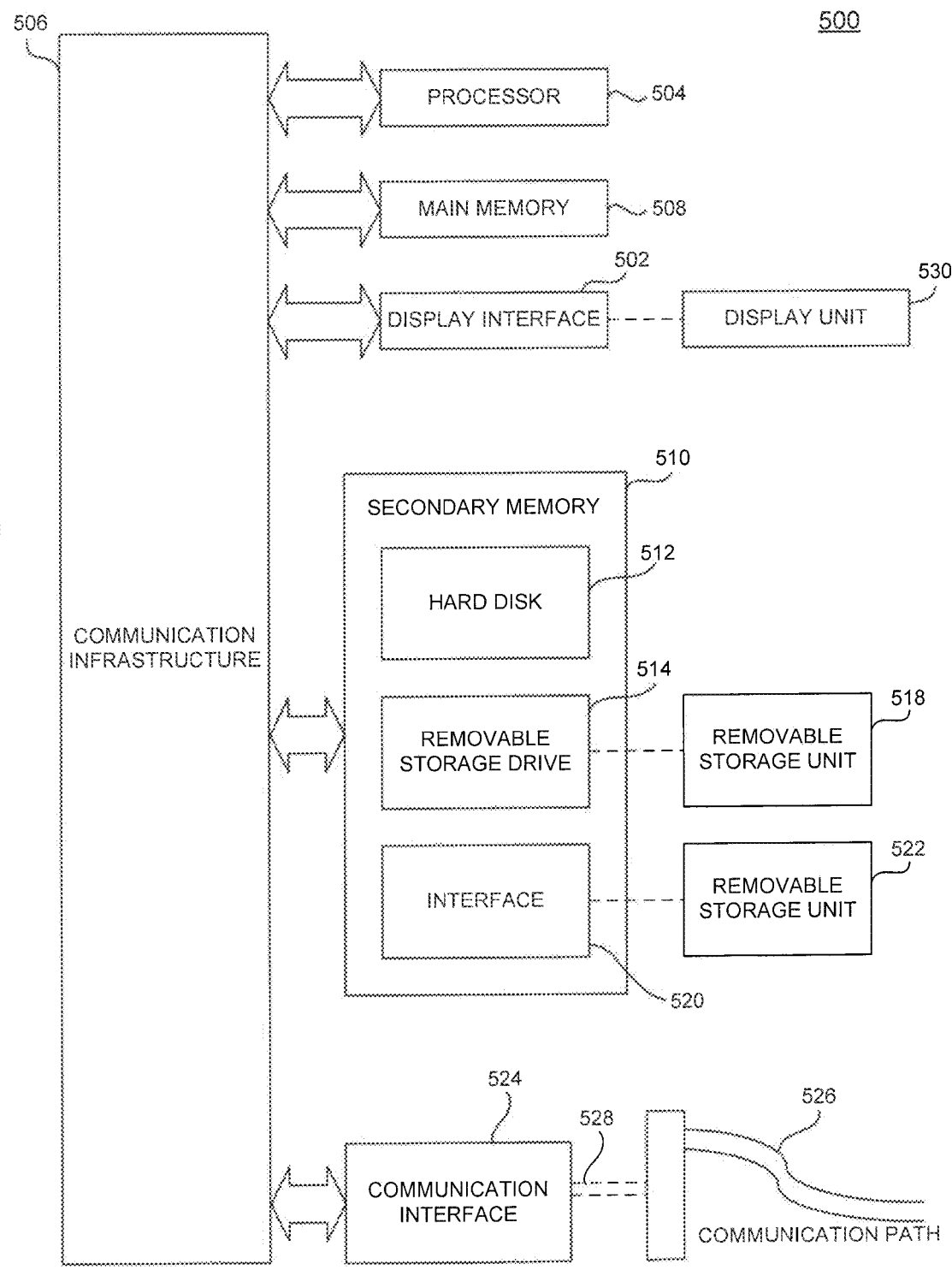
FIG. 5 is an illustration of an example computer system in which embodiments, or portions thereof, can be implemented as computer readable code.

Various aspects of embodiments of the present invention may be implemented in software, firmware, hardware, or a combination thereof. FIG. 5 is an illustration of an example computer system 500 in which embodiments of the present invention, or portions thereof, can be implemented as computer-readable code. For example, the method illustrated by flowchart 400 of FIG. 4 can be implemented in system 500. Various embodiments of the present invention are described in terms of this example computer system 500. After reading this description, it will become apparent to a person skilled in the relevant art how to implement embodiments of the present invention using other computer systems and/or computer architectures.

It should be noted that the simulation, synthesis and/or manufacture of various embodiments of this invention may be accomplished, in part, through the use of computer readable code, including general programming languages (such as C or C++), hardware description languages (HDL) such as, for example, Verilog HDL, VHDL, Altera HDL (AHDL), or other available programming and/or schematic capture tools (such as circuit capture tools). This computer readable code can be disposed in any known computer-usable medium including a semiconductor, magnetic disk, optical disk (such as CD-ROM, DVD-ROM). As such, the code can be transmitted over communication networks including the Internet. It is understood that the functions accomplished and/or structure provided by the systems and techniques described above can be represented in a core that is embodied in program code and can be transformed to hardware as part of the production of integrated circuits.

Computer system 500 includes one or more processors, such as processor 504. Processor 504 may be a special purpose or a general-purpose processor. Processor 504 is connected to a communication infrastructure 506 (e.g., a bus or network).

Computer system 500 also includes a main memory 508, preferably random access memory (RAM), and may also include a secondary memory 510. Secondary memory 510 can include, for example, a hard disk drive 512, a removable storage drive 514, and/or a memory stick. Removable storage drive 514 can include a floppy disk drive, a magnetic tape drive, an optical disk drive, a flash memory, or the like. The removable storage drive 514 reads from and/or writes to a removable storage unit 518 in a well-known manner. Removable storage unit 518 can comprise a floppy disk, magnetic tape, optical disk, etc. which is read by and written to by removable storage drive 514. As will be appreciated by a person skilled in the relevant art, removable storage unit 518 includes a computer-usable storage medium having stored therein computer software and/or data.

Computer system 500 (optionally) includes a display interface 502 (which can include input and output devices such as keyboards, mice, etc.) that forwards graphics, text, and other data from communication infrastructure 506 (or from a frame buffer not shown) for display on display unit 530.

In alternative implementations, secondary memory 510 can include other similar devices for allowing computer programs or other instructions to be loaded into computer system 500. Such devices can include, for example, a removable storage unit 522 and an interface 520. Examples of such devices can include a program cartridge and cartridge interface (such as those found in video game devices), a removable memory chip (e.g., EPROM or PROM) and associated socket, and other removable storage units 522 and interfaces 520 which allow software and data to be transferred from the removable storage unit 522 to computer system 500.

Computer system 500 can also include a communications interface 524. Communications interface 524 allows software and data to be transferred between computer system 500 and external devices. Communications interface 524 can include a modem, a network interface (such as an Ethernet card), a communications port, a PCMCIA slot and card, or the like. Software and data transferred via communications interface 524 are in the form of signals which may be electronic, electromagnetic, optical, or other signals capable of being received by communications interface 524. These signals are provided to communications interface 524 via a communications path 526. Communications path 526 carries signals and can be implemented using wire or cable, fiber optics, a phone line, a cellular phone link, a RF link or other communications channels.

In this document, the terms "computer program medium," "computer-usable medium" and "non-transitory medium" are used to generally refer to tangible media such as removable storage unit 518, removable storage unit 522, and a hard disk installed in hard disk drive 512. Computer program medium and computer-usable medium can also refer to tangible memories, such as main memory 508 and secondary memory 510, which can be memory semiconductors (e.g., DRAMs, etc.). These computer program products provide software to computer system 500.

Computer programs (also called computer control logic) are stored in main memory 508 and/or secondary memory 510. Computer programs may also be received via communications interface 524. Such computer programs, when executed, enable computer system 500 to implement embodiments of the present invention as discussed herein. In particular, the computer programs, when executed, enable processor 504 to implement processes of embodiments of the present invention, such as the steps in the method illustrated by flowchart 400 of FIG. 4 can be implemented in system 500, discussed above. Accordingly, such computer programs represent controllers of the computer system 500. Where embodiments of the present invention are implemented using software, the software can be stored in a computer program product and loaded into computer system 500 using removable storage drive 514, interface 520, hard drive 512, or communications interface 524.

Embodiments are also directed to computer program products including software stored on any computer-usable medium. Such software, when executed in one or more data processing device, causes a data processing device(s) to operate as described herein. Embodiments of the present invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

It is to be appreciated that the Detailed Description section, and not the Summary and Abstract sections, is intended to be used to interpret the claims. The Summary and Abstract sections may set forth one or more but not all example embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by a person skilled in the relevant art in light of the teachings and guidance.

The breadth and scope of the present invention should not be limited by any of the above-described example embodiments, but should be defined only in accordance with the following claims and their equivalents.

What is claimed is:

1. A system for chip debug, the system comprising:
   a plurality of functional blocks;
   a debug path coupling the plurality of functional blocks in a daisy chain configuration, wherein an end functional block from the plurality of functional blocks is at an end of the daisy chain configuration; and
   a debug bus steering module configured to pass one or more debug signals associated with a first functional block from the plurality of functional blocks along the debug path to the end functional block while a second functional block from the plurality of functional blocks performs one or more power gating cycles,
   wherein the one or more debug signals associated with the first functional block passes to the end functional block through powered-down functional blocks.

2. The system of claim 1, further comprising:
   a logic analyzer coupled to an output of the end functional block and configured to receive the one or more debug signals; and
   a power gating finite state machine configured to enable and disable the one or more power gating cycles of the second functional block.

3. The system of claim 1, wherein the plurality of functional blocks comprises one or more power gated functional blocks, one or more non-power gated functional blocks, or a combination thereof.

4. The system of claim 3, wherein each of the one or more power gated functional blocks comprises a debug wrapper configured to pass the one or more debug signals to the debug bus steering module.

5. The system of claim 1, wherein the debug bus steering module comprises a control signal to operate the debug bus steering module in a synchronous mode of operation or an asynchronous mode of operation.

6. The system of claim 1, wherein the debug bus steering module comprises a plurality of multiplexers and control signals to concatenate the one or more debug signals with another one or more debug signals to pass the one or more debug signals and the another one or more debug signals along the debug path in a serial manner.

7. The system of claim 1, wherein the one or more debug signals are associated with debug signals associated with a power gated functional block, debug signals associated with a non-power gated functional block, or a combination thereof.

8. The system of claim 1, wherein the debug bus steering module is configured to receive a sequence of a fixed signature, then the one or more debug signals, and then the fixed signature.

9. The system of claim 1, wherein each of the plurality of functional blocks comprises one or more processing units.

10. The system of claim 1, wherein the plurality of functional blocks comprises a first functional block in a first tile and a second functional block in a second tile, and wherein the first functional block is configured to execute one or more instructions in parallel or in a pipeline manner with the second functional block.

11. A method for chip debug, the method comprising:
    power cycling one or more functional blocks from a plurality of functional blocks, wherein the plurality of functional blocks are coupled in a daisy chain configuration along a debug path and wherein an end functional block from the plurality of functional blocks is at an end of the daisy chain configuration; and
    passing one or more debug signals associated with a first functional block from the plurality of functional blocks along the debug path to the end functional block during the power cycling of the one or more functional blocks,
    wherein the one or more debug signals associated with the first functional block passes to the end functional block through powered-down functional blocks.

12. The method of claim 11, wherein the power cycling comprises enabling and disabling power from the one or more functional blocks.

13. The method of claim 11, wherein the passing comprises passing the one or more debug signals in a synchronous manner or an asynchronous manner.

14. The method of claim 11, wherein the passing comprises concatenating the one or more debug signals with another one or more debug signals to pass the one or more debug signals and the another one or more debug signals along the debug path in a serial manner.

15. The method of claim 11, wherein the passing comprises receiving a sequence of a fixed signature, then the one or more debug signals, and then the fixed signature.

16. A tangible computer readable medium having stored therein one or more sequences of one or more instructions for execution by one or more processors to perform a method for chip debug, the method comprising:
- power cycling one or more functional blocks from a plurality of functional blocks, wherein the plurality of functional blocks are coupled in a daisy chain configuration along a debug path and wherein an end functional block from the plurality of functional blocks is at an end of the daisy chain configuration; and
- passing one or more debug signals associated with a first functional block from the plurality of functional blocks along the debug path to the end functional block during the power cycling of the one or more functional blocks, wherein the one or more debug signals associated with the first functional block passes to the end functional block through powered-down functional blocks.

17. The tangible computer readable medium of claim 16, wherein the power cycling comprises enabling and disabling power from the one or more functional blocks.

18. The tangible computer readable medium of claim 16, wherein the passing comprises passing the one or more debug signals in a synchronous manner or an asynchronous manner.

19. The tangible computer readable medium of claim 16, concatenating the one or more debug signals with another one or more debug signals to pass the one or more debug signals and the another one or more debug signals along the debug path in a serial manner.

20. The tangible computer readable medium of claim 16, wherein the passing comprises receiving a sequence of a fixed signature, then the one or more debug signals, and then the fixed signature.

* * * * *